United States Patent [19]

Ebata et al.

[11] Patent Number: 4,489,250
[45] Date of Patent: Dec. 18, 1984

[54] TEMPERATURE COMPENSATED SURFACE ACOUSTIC WAVE DEVICE

[75] Inventors: Yasuo Ebata; Hitoshi Suzuki, both of Yokohama; Sadao Matsumura, Tokyo; Katsuyoshi Fukuta, Kawasaki, all of Japan

[73] Assignee: Tokyo Shibaura Denki Kabushiki Kaisha, Kawasaki, Japan

[21] Appl. No.: 508,044

[22] Filed: Jun. 27, 1983

[30] Foreign Application Priority Data

Jun. 30, 1982 [JP] Japan ................... 57-112974

[51] Int. Cl.³ .............................. H03H 9/25
[52] U.S. Cl. ............................ 310/313 A; 333/155
[58] Field of Search .............. 310/313 A, 313 B; 333/155; 331/107 A

[56] References Cited

FOREIGN PATENT DOCUMENTS 2083694 3/1982 United Kingdom .

OTHER PUBLICATIONS

Electronics Letters, 8th Jan. 1981, pp. 11–12, "Lithium Tetraborate; A New Temperature-Compensated SAW Substrate Material", R. W. Whatmore, N. M. Shorrocks, C. O'Hara, F. W. Ainger.
Proc. of the Ultrasonics Symposium IEEE 1981 Oct., pp. 337–34D, "Lithium Tetraborate-S New Temperature Compensated Piezoelectric Substrate Material for Surface Acoustic Wave Devices", N. M. Shorrocks, R. W. Whatmore, F. W. Ainger, I. M. Young, the symp. was held on Oct. 14–16, 1981.

Primary Examiner—J. D. Miller
Assistant Examiner—D. L. Rebsch
Attorney, Agent, or Firm—Oblon, Fisher, Spivak, McClelland & Maier

[57] ABSTRACT

A surface acoustic wave device having a lithium tatraborate single crystal substrate is proposed. An electro-mechanical coupling coefficient $K^2$ of the substrate is about 1% so as to obtain a surface acoustic wave having sufficient practical energy. When cut angles of the substrate and a propagation direction of the surface acoustic wave are expressed by Eulerian angles ($90+\lambda$, 90°, 90°), a thickness t of an electrode formed on the substrate falls within a region bounded by a dotted curve and an alternate long and short dash curve in FIG. 8. The dotted curve and the alternate long and short dash curve indicate the experimental relationship between the cut angle $\lambda$ and the thickness t when the TCD is set at 5 and −5 ppm/°C., respectively. When the film thickness t is set within the above-mentioned range, the absolute value of the TCD is set at 5 ppm/°C. or less. When the cut angle $\lambda$ is 25°, the TCD of the substrate becomes zero. Therefore, using the substrate having the above cut angle, the TCD becomes zero or almost zero in the electrode region and nonelectrode region of the surface of the substrate.

8 Claims, 10 Drawing Figures

TEMPERATURE COMPENSATED SURFACE ACOUSTIC WAVE DEVICE

BACKGROUND OF THE INVENTION

The present invention relates to a surface acoustic wave device using lithium tetraborate ($Li_2B_4O_7$) which is a piezoelectric material.

In general, an interdigital electrode is formed on a substrate (elastic base) of a piezoelectric material in a surface acoustic wave device. A surface acoustic wave is propagated at a surface of the elastic base. The surface acoustic wave device of this type has a filtering function. The filtering characteristics can be arbitrarily changed by changing the electrode pattern. For this reason, the surface acoustic wave device has been applied to a surface acoustic wave filter, a surface acoustic wave resonator, and a surface acoustic oscillator.

While the electromechanical coupling coefficient $K^2$ is required to be large in such a device, the center frequency of the filter or the resonant frequency of the resonator is also required to remain constant irrespective of a change in temperature. A temperature coefficient of delay time (to be briefly referred to as a TCD hereinafter) is used as a criterion of stability of the center frequency or the like against a change in temperature. A small TCD is required to stabilize the center frequency. Delay time is a time interval taken for the surface acoustic wave to propagate between two adjacent electrode elements of the interdigital electrode formed on the substrate. The TCD is a rate of change in delay time with respect to temperature. The electromechanical coupling coefficient $K^2$ is one of the constants which determines an energy conversion efficiency so as to convert an electric signal to a surface acoustic wave.

FIG. 1 is a graph showing the characteristics of substrates made of various piezoelectric materials wherein the TCD is plotted along the axis of abscissa and the coupling coefficient $K^2$ is plotted along the axis of ordinate. 128°Y—X.LiNbO$_3$ (lithium niobate) has a large coupling coefficient $K^2$. But this material is not preferred as a surface acoustic wave element since its absolute value of TCD is also large. In the case of X—11-2°Y.LiTaO$_3$ (lithium tantalate), its coupling coefficient $K^2$ is as large as about 0.8%, but its absolute value of the TCD is as large as about 20 ppm/°C. This material is not preferred as a surface acoustic wave element. The TCD of ST-cut crystal is zero and the $K^2$ thereof is as small as 0.2% or less. This material is difficult to use as a surface acoustic wave element. Unlike these materials, 25°X—Z.Li$_2$B$_4$O$_7$ (lithium tetraborate) has a coupling coefficient $K^2$ as large as about 1% and a TCD of zero. For this reason, lithium tetraborate has received much attention as a piezoelectric material for a surface acoustic wave element. "25°X—Z" indicates that the cut surface of the substrate is perpendicular to a rotated X-axis obtained by rotating the X-axis through 25° about the Z-axis toward the Y-axis, and that the propagation or transfer direction of the surface acoustic wave is parallel to the Z-axis. "25°X—Z" may be transformed to Eulerian angles (115°, 90°, 90°).

However, since surface acoustic wave energy is concentrated on the surface of the substrate, the propagation characteristics of the surface acoustic wave change, depending on the surface state of the substrate. In the surface acoustic wave device, a metal such as aluminum (Al) must be deposited on the surface of the substrate to form an electrode. For this reason, even if a lithium tetraborate substrate (TCD: 0) is used, the TCD changes from zero in the surface acoustic wave device having the aluminum electrode film formed on its substrate. In particular, when a lithium tetraborate single crystal substrate is used, the surface state of the substrate greatly influences the propagation characteristics of the surface acoustic wave. Therefore, no conventional surface acoustic wave device having a substantially zero TCD has become commercially available.

SUMMARY OF THE INVENTION

It is an object of the present invention to provide a surface acoustic wave device using $Li_2B_4O_7$ wherein a TCD thereof is substantially zero and a delay time is substantially constant irrespective of a change in temperature.

It is another object of the present invention to provide a surface acoustic wave device with a large coupling coefficient $K^2$ so as to convert an electric signal to a surface acoustic wave with high efficiency.

The present invention is based on the fact that the following phenomenon occurs when an electrode is formed on a lithium tetraborate single crystal substrate. Even if the lithium tetrborate substrate (TCD: 0) is used, the TCD changes to a negative value when only a small amount of aluminum is deposited on the substrate. However, when the aluminum film thickness is increased, the TCD changes to a positive value. In other words, a change in TCD is positive in accordance with a change in film thickness t. Therefore, a film thickness $t_0$ can be determined so as to set the TCD to be zero. When the film thickness t is set near the thickness $t_0$, a surface acoustic wave device can be obtained wherein the TCD thereof is substantially zero. The film thickness $t_0$ differs in accordance with the cut angle of the substrate and the propagation direction of the surface acoustic wave. The present inventors have determined through experiment the film thickness t which falls within a range corresponding to good TCD values used for practical surface acoustic wave devices in accordance with the relationship between the TCD and the cut angle of the substrate or the propagation direction of the surface acoustic wave.

According to the present invention, there is provided a surface acoustic wave device which has a lithium tetraborate single crystal substrate and a film-like electrode formed on the substrate. The cut angle of the substrate and the propagation direction of a surface acoustic wave are indicated by Eulerian angles (90°+λ, 90°+μ, 90°+θ). The electrode has a thickness t normalized by a wavelength of the surface acoustic wave. The electrode can generate the surface acoustic wave on the surface of the substrate, which propagates along the propagation direction. The thickness t of the electrode is set within a range determined by angles λ, μ, and θ such that the TCD satisfies inequality (1) below:

$$-5 \text{ ppm/°C} \leq TCD \leq 5 \text{ ppm/°C}. \tag{1}$$

When the electrode is made of a metallic material comprising aluminum, the normalized thickness t of the electrode is set to satisfy inequality (2) below:

$$f(\lambda, \mu, \theta) \leq t \leq F(\lambda, \mu, \theta) \tag{2}$$

wherein functions $F(\lambda, \mu, \theta)$ and $f(\lambda, \mu, \theta)$ satisfy equations (3) to (8) below:

$$F(\lambda, 0, 0) = 1.6 \times 10^{-2} + 8.8 \times 10^{-6}\lambda - \quad (3)$$
$$3.5 \times 10^{-5}\lambda^2 + 1.1 \times 10^{-6}\lambda^3 - 1.3 \times 10^{-8}\lambda^4$$

$$F(0, \mu, 0) = 1.6 \times 10^{-2} + 5.3 \times 10^{-4}\mu + \quad (4)$$
$$5.9 \times 10^{-5}\mu^2 - 8.6 \times 10^{-6}\mu^3 + 2.7 \times 10^{-7}\mu^4 - 2.9 \times 10^{-9}\mu^5$$

$$F(0, 0, \theta) = 1.6 \times 10^{-2} - 2.4 \times 10^{-4}\theta - \quad (5)$$
$$1.0 \times 10^{-4}\theta^2 + 3.4 \times 10^{-7}\theta^3$$

$$f(\lambda, 0, 0) = 9.5 \times 10^{-3} + 1.2 \times 10^{-4}\lambda - \quad (6)$$
$$3.9 \times 10^{-5}\lambda^2 + 1.3 \times 10^{-6}\lambda^3 - 1.6 \times 10^{-8}\lambda^4$$

$$f(0, \mu, 0) = 9.5 \times 10^{-3} + 8.4 \times 10^{-4}\mu - \quad (7)$$
$$9.4 \times 10^{-5}\mu^2 + 6.6 \times 10^{-6}\mu^3 - 3.0 \times 10^{-7}\mu^4 + 4.5 \times 10^{-9}\mu^5$$

$$f(0, 0, \theta) = 9.5 \times 10^{-3} + 3.0 \times 10^{-4}\theta - \quad (8)$$
$$2.0 \times 10^{-4}\theta^2 + 3.6 \times 10^{-6}\theta^3$$

The metallic material comprising aluminum, which is used in the present invention, may be either a pure aluminum material or an aluminum alloy material containing copper, silicon or molybdenum.

When the normalized film thickness of the electrode is set within the range satisfying inequality (2), the absolute value of the TCD of the surface acoustic wave device is set to be 5 ppm/°C. or less. The coupling coefficient of lithium tetraborate is as large as about 1%. Therefore, the surface acoustic wave device of the present invention has superior characteristics relative to the conventional surface acoustic wave device in that a change in delay time due to a change in temperature is small and an electric signal is converted to a surface acoustic wave with high efficiency.

It is preferred that a crystal be pulled along the X-axis and an obtained single crystal mass be cut along a direction perpendicular to the X-axis, thereby simplifying working procedures. As defined in claims 5 to 10, any two of the angles $\lambda$, $\mu$ and $\theta$ are preferably set to be zero.

As is apparent from equations (3) to (8), the relationship between the film thickness t of the electrode and the TCD is solely determined by the cut surface (cut angles) of the substrate and the propagation direction of the surface acoustic wave. According to the present invention, the TCD can be easily set to be zero or near zero by only adjusting the film thickness t.

When the cut angles $\lambda$ and $\mu$, and the propagation direction (angle) $\theta$ are set to satisfy equation (9) below, the TCD of a substrate having no Al electrode film thereon can be substantially zero:

$$(\lambda/25)^2 + (\mu/10)^2 + (\theta/8)^2 = 1 \quad (9)$$

In the surface acoustic wave device which has the substrate of this type and the Al electrode film which satisfies inequality (2), the electrode formation portion and the remaining portion of the substrate have a TCD of substantially zero. For this reason, a highly precise surface acoustic wave device having stability against a change in temperature can be obtained.

Since lithium tetraborate single crystal is used for a substrate, the electromechanical coupling coefficient $K^2$ is as large as about 1%. Therefore, according to the present invention, a highly efficient surface acoustic wave device can be obtained for a variety of practical applications.

DETAILED DESCRIPTION OF THE PREFERRED EMBODIMENTS

Figure 2:
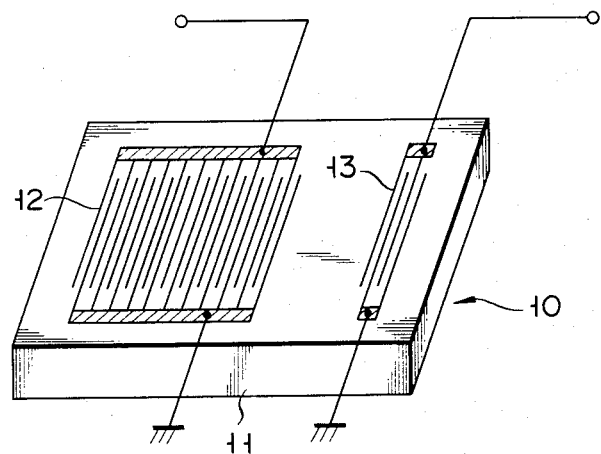
FIG. 2 is a perspective view of a surface acoustic wave filter.
Figure 3:
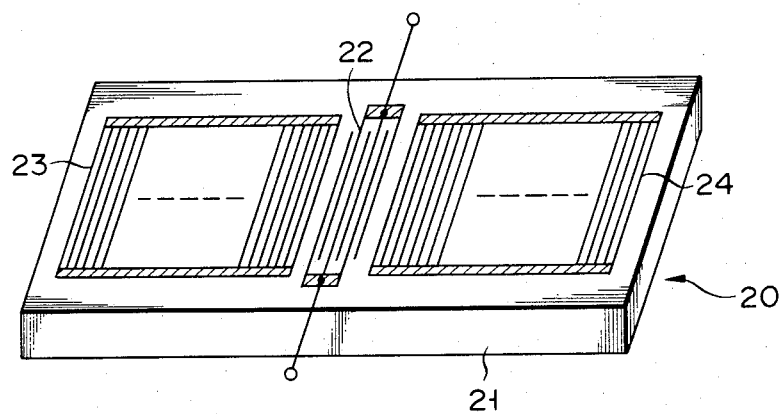
FIG. 3 is a perspective view of a surface acoustic wave resonator.

A surface acoustic wave device according to the present invention can be embodied in a surface acoustic wave filter (FIG. 2) or a surface acoustic wave resonator (FIG. 3).

FIGS. 2 and 3 are perspective views of a surface acoustic wave filter and a surface acoustic wave resonator, respectively. Referring to FIG. 2, a surface acoustic wave filter 10 has a substrate 11 of a piezoelectric material, an input electrode 12 and an output electrode 13. The input and output electrodes 12 and 13 are formed on the substrate 11 in an interdigital arrangement. Only a given frequency component determined by an electrode element pitch of the electrode 12 and a velocity of the surface acoustic wave can pass between the input and output electrodes 12 and 13. Referring to FIG. 3, a surface acoustic wave resonator 20 has a piezoelectric substrate 21, a terminal electrode 22 formed on the substrate 21, and reflecting electrodes 23 and 24 formed at two ends of the substrate 21 with respect to the terminal electrode 22 as their center so as to constitute a grating reflector. In this case, the cut angles $\lambda$ and $\mu$ of each of the substrates 11 and 21 and a propagation direction (angle) $\theta$ of the surface acoustic wave are given by Eulerian angles ($90° + \lambda$, $90° + \mu$, $90° + \theta$). The relationship between the Eulerian angles and a normalized film thickness t of each of the electrodes 12, 13, 22, 23 and 24 is given to satisfy inequality (2) as follows:

$$f(\lambda, \mu, \theta) \leq t \leq F(\lambda, \mu, \theta) \quad (2)$$

wherein functions $F(\lambda, \mu, \theta)$ and $f(\lambda, \mu, \theta)$ satisfy equations (3) to (8) below:

$$F(\lambda, 0, 0) = 1.6 \times 10^{-2} + 8.8 \times 10^{-6}\lambda - \quad (3)$$
$$3.5 \times 10^{-5}\lambda^2 + 1.1 \times 10^{-6}\lambda^3 - 1.3 \times 10^{-8}\lambda^4$$

$$F(0, \mu, 0) = 1.6 \times 10^{-2} + 5.3 \times 10^{-4}\mu + \quad (4)$$

-continued $$5.9 \times 10^{-5}\mu^2 - 8.6 \times 10^{-6}\mu^3 + 2.7 \times 10^{-7}\mu^4 - 2.9 \times 10^{-9}\mu^5$$

$$F(0, 0, \theta) = 1.6 \times 10^{-2} - 2.4 \times 10^{-4}\theta - \quad (5)$$

$$1.0 \times 10^{-4}\theta^2 + 3.4 \times 10^{-7}\theta^3$$

$$f(\lambda, 0, 0) = 9.5 \times 10^{-3} + 1.2 \times 10^{-4}\lambda - \quad (6)$$

$$3.9 \times 10^{-5}\lambda^2 + 1.3 \times 10^{-6}\lambda^3 - 1.6 \times 10^{-8}\lambda^4$$

$$f(0, \mu, 0) = 9.5 \times 10^{-3} + 8.4 \times 10^{-4}\mu - \quad (7)$$

$$9.4 \times 10^{-5}\mu^2 + 6.6 \times 10^{-6}\mu^3 - 3.0 \times 10^{-7}\mu^4 + 4.5 \times 10^{-9}\mu^5$$

$$f(0, 0, \theta) = 9.5 \times 10^{-3} + 3.0 \times 10^{-4}\theta - \quad (8)$$

$$2.0 \times 10^{-4}\theta^2 + 3.6 \times 10^{-6}\theta^3$$

When the normalized film thickness t of each electrode is set within the range satisfying inequality (2), the absolute value of the TCD of the surface acoustic wave device is set to be 5 ppm/°C. or less. Therefore, the center frequency of the surface acoustic wave filter 10 and the resonant frequency of the surface acoustic wave resonator 20 may not greatly change with respect to a change in temperature, thereby allowing such changes to be neglected in practice.

The present inventors determined, by experiment, that the TCD becomes substantially zero when the normalized film thickness t falls within the range given by inequality (2). This experiment will be described in detail hereinafter.

Figure 1:
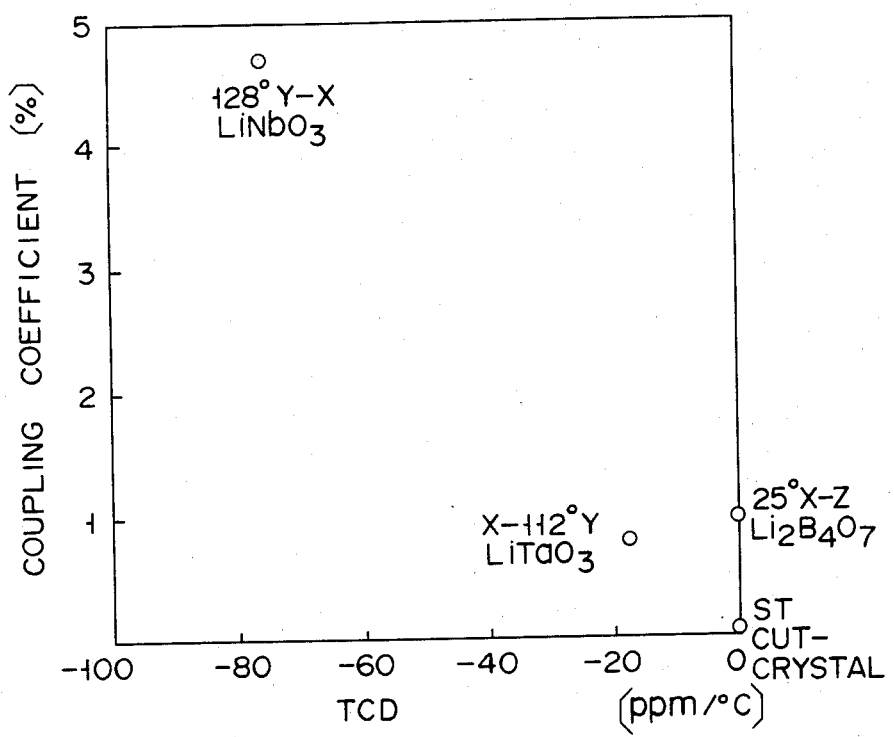
FIG. 1 is a graph for explaining characteristics of substrates made of various piezoelectric materials, wherein the temperature coefficient of delay time (TCD) is plotted along the axis of abscissa and the electromechanical coupling coefficient $K^2$ is plotted along the ordinate.
Figure 4:
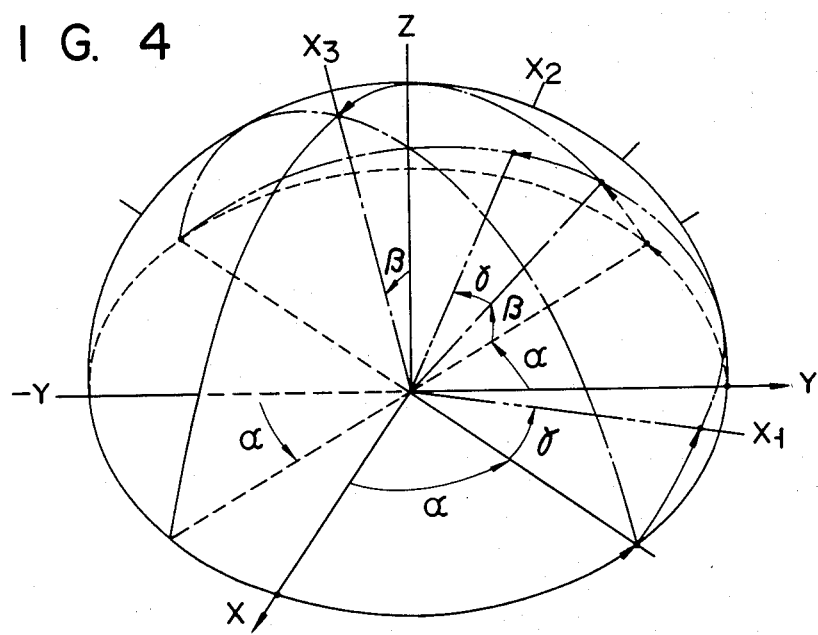
FIG. 4 is a representation for explaining Eulerian angles.

The cut angles of the substrate and the propagation direction of the surface acoustic wave will be expressed by Eulerian angles later with reference to FIG. 4. Assume that a three-dimensional orthogonal coordinate system is given so as to have X-, Y- and Z-axes. Also assume that the propagation direction of the surface acoustic wave corresponds to an $X_1$-axis, a direction parallel to the surface of the lithium tetraborate single crystal substrate and perpendicular to the direction $X_1$ corresponds to an $X_2$-axis, and a direction perpendicular to the substrate surface corresponds to an $X_3$-axis. When the X-, Y- and Z-axes coincide with the $X_1$-, $X_2$- and $X_3$-axes, respectively, Eulerian angles are given as (0, 0, 0) (reference orientation). The surface acoustic wave propagation direction (the $X_1$-axis) is rotated counterclockwise through an angle $\alpha$ about the $X_3$-axis in the direction from the X-axis to the Y-axis. Subsequently, the $X_3$-axis is rotated counterclockwise through an angle $\beta$ about the rotated $X_1$-axis in the direction from the Z-axis to the X-axis. Finally, the rotated $X_1$-axis is rotated again counterclockwise through an angle $\gamma$ about the rotated $X_3$-axis in the direction from the X-axis to the Y-axis. When the surface acoustic wave propagation direction (the $X_1$-axis) and the direction (the $X_3$-axis) perpendicular to the substrate surface (cut surface) are oriented as described above, Eulerian angles are given as ($\alpha$, $\beta$, $\gamma$). For example, Eulerian angles (90°, 90°, 90°) indicate an "X-cut Z-propagation" (i.e., the substrate surface is perpendicular to the X-axis and the surface acoustic wave propagation direction is aligned with the Z-axis).

Figure 5:
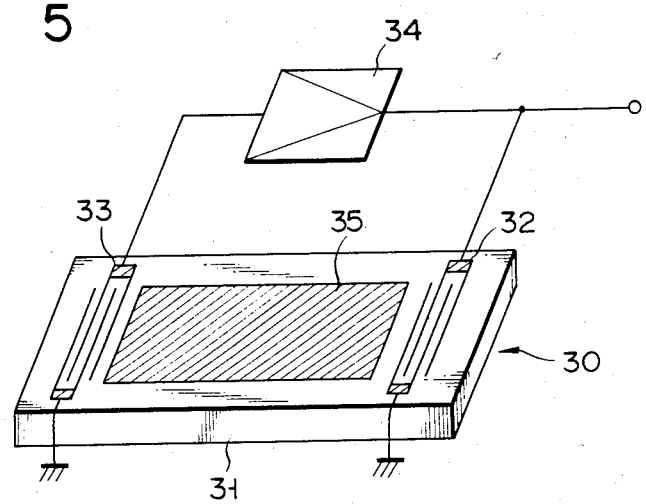
FIG. 5 is a perspective view of an experimental apparatus for measuring the TCD.

A method for measuring the TCD will now be described. According to the present inventors, the TCD was not measured in accordance with a change in center frequency of the surface acoustic wave filter or resonant frequency of the surface acoustic wave resonator, since precision of such measurement was greatly degraded. Instead, a change in delay time was measured with respect to a change in temperature, using a surface acoustic wave oscillator 30 (FIG. 5). The oscillator 30 has an $Li_2B_4O_7$ single crystal substrate 31, an aluminum input electrode 32 and an aluminum output electrode 33. The input and output electrodes 32 and 33 are formed on the substrate 31. An amplifier 34 connected between the electrodes 32 and 33 has a gain so as to sufficiently compensate for an insertion loss of a delay line constituted by the electrodes 32 and 33. An aluminum dummy electrode film 35 is formed in a surface acoustic wave propagation path on the substrate surface between the electrodes 32 and 33. The oscillator 30 is connected to a frequency counter (not shown) so as to measure an oscillation frequency with high precision. The temperature coefficient of delay time TCD is defined by the following equation: $TCD = (\Delta\tau/\tau)/\Delta T$ where $\tau$ is the delay time, $\Delta\tau$ is the change in delay time, and $\Delta T$ is the change in temperature. The proportional relation $f_0 \propto 1/\tau$ is given, where $f_0$ is the oscillation frequency and $\Delta f$ is the change in oscillation frequency. As a result, the TCD is given as follows:

$$TCD = -(1/f_0)(\Delta f/\Delta T) \quad (13)$$

The change $\Delta f$ in oscillation frequency with respect to the change $\Delta T$ in temperature can be measured by the frequency counter with high precision. According to equation (13), the TCD can thus be measured with high precision, in comparison with the measurement of a change in the center frequency or the resonant frequency. When the thickness t of the Al film 35 is varied to measure the corresponding TCD, the relationship between the thickness t and the TCD can be determined.

Figure 6:
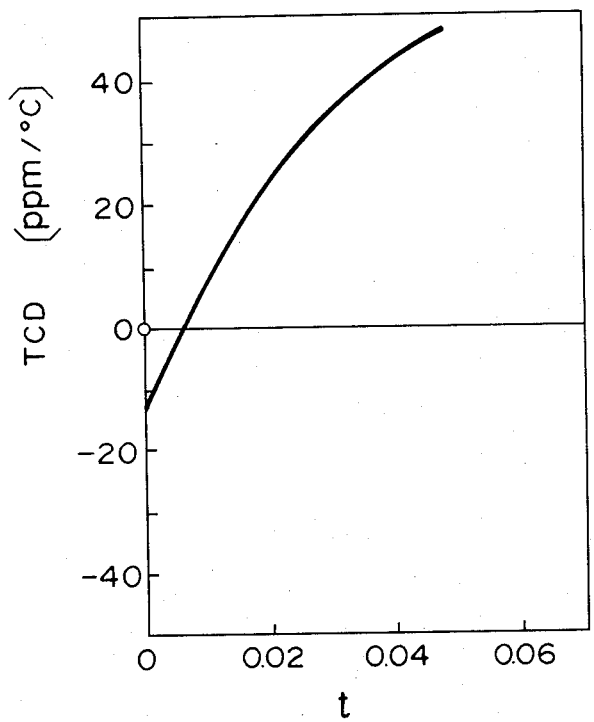
FIGS. 6 and 7 are graphs for explaining the relationships between the aluminum film thickness t normalized by the wavelength of the surface acoustic wave and the temperature coefficient of delay time TCD, respectively.

FIG. 6 shows the relationship between the thickness t of the Al film 35 formed in the propagation path and the TCD when the Eulerian angles are given as (115°, 90°, 90°). According to these surface acoustic wave propagation conditions, the direction perpendicular to the surface of the $Li_2B_4O_7$ single crystal substrate 31 is aligned with the direction obtained by rotating an axis through 25° in the direction from the X-axis to the Y-axis, and the surface acoustic wave propagation direction is aligned with the Z-axis. The thickness t of the Al film 35 plotted along the axis of abscissa is normalized by dividing the actual film thickness by the wavelength of the surface acoustic wave. If the Al film 35 is not formed in the propagation path, the TCD is zero as indicated by a hollow circle in FIG. 6. When an aluminum film is formed only with a slight thickness, the TCD decreases to about $-15$ ppm/°C. When the film thickness t increases, the TCD increases accordingly. When the normalized film thickness t is set to be 0.006 (0.006 times the wavelength of the surface acoustic wave), the TCD is set to be zero. Furthermore, when the normalized film thickness falls within a range between 0.004 and 0.009, the TCD falls within a range between $-5$ ppm/°C. and 5 ppm/°C. Within this range, a change in actual delay time with respect to a change in temperature can be neglected; the TCD becomes substantially zero.

Figure 7:
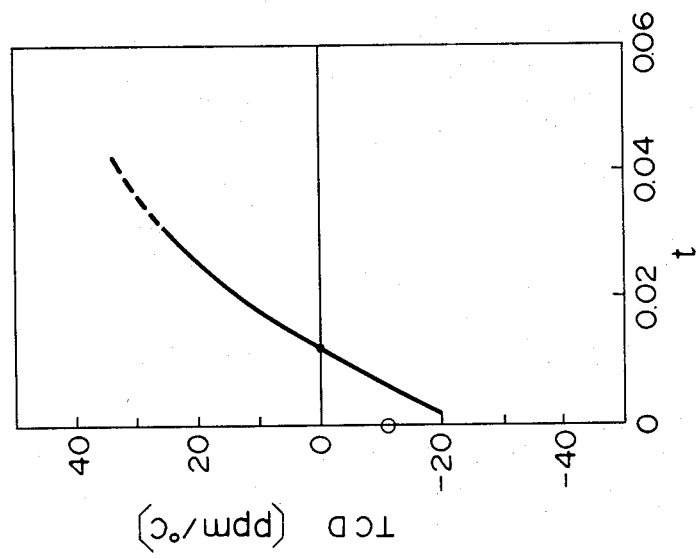

FIG. 7 shows the relationship between the thickness t of the Al film 35 and the TCD when Eulerian angles are given as (90°, 90°, 90°) (i.e., an "X-cut Z-propagation" substrate 31 is used). As indicated by a hollow circle, when the film thickness t is zero, the TCD is set to be about $-11$ ppm/°C. When an aluminum film is formed with a slight thickness, the TCD becomes about −20 ppm/°C. or less. The TCD increases in accordance with an increase in the film thickness t. When the normalized film thickness t is increased to about 0.013 (0.013 times the wavelength of the surface acoustic wave), the TCD becomes zero. Under the surface acoustic wave propagation conditions described above, when the normalized film thickness falls within a range between 0.010 and 0.016, the TCD falls within a range between −5 ppm/°C. and 5 ppm/°C.

Even in the $Li_2B_4O_7$ substrate wherein the cut angles $\lambda$ and $\mu$ and the propagation direction $\theta$ are given as Eulerian angles (90°+$\lambda$, 90°+$\mu$, 90°+$\theta$), the Al film thickness t can be set within a proper range determined by the cut angles $\lambda$ and $\mu$ and the propagation direction $\theta$, and hence the TCD can be set to be substantially zero. As a result, a high-performance surface acoustic wave device can be obtained.

Figure 8:
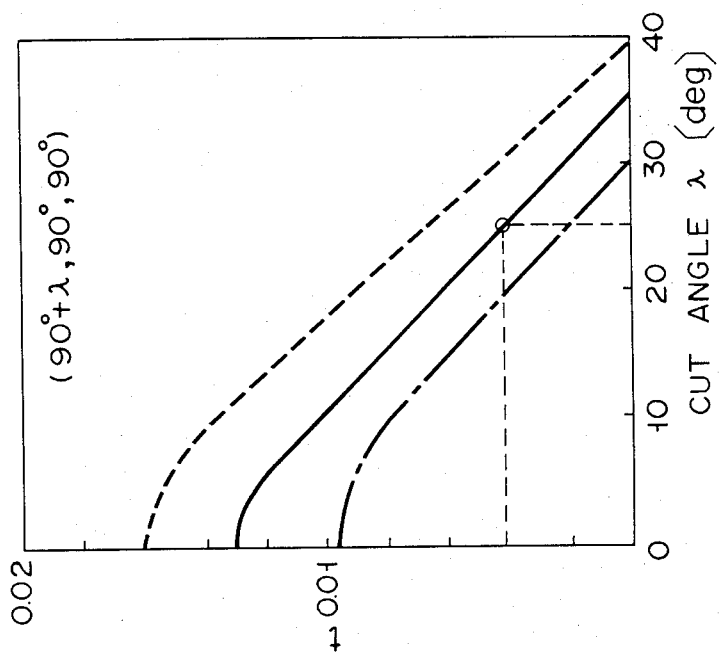
FIGS. 8, 9 and 10 are graphs for explaining the relationships between the cut angles $\lambda$ and $\mu$, the propagation direction (angle) $\theta$, and the film thickness t, respectively.
Figure 10:
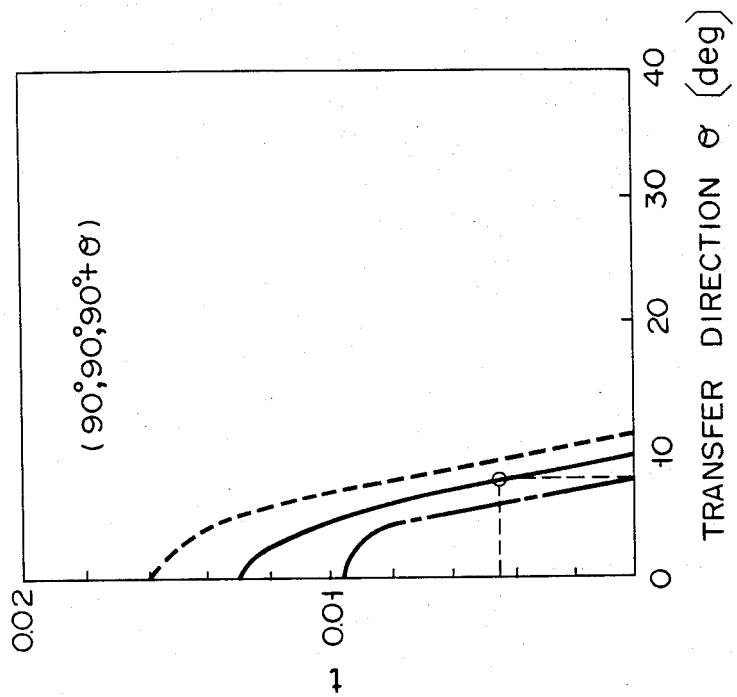
Figure 9:
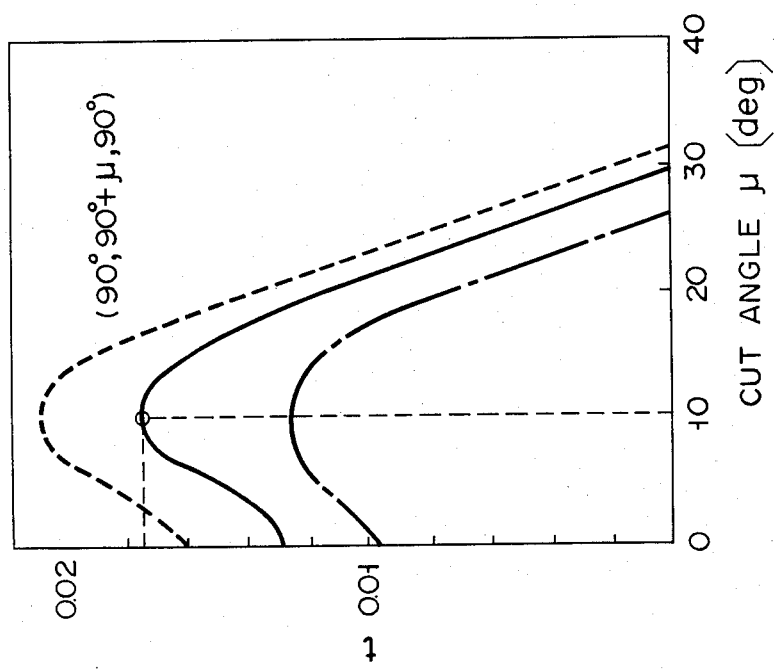

FIGS. 8 to 10 are graphs for explaining the relationships between the cut angle $\lambda$ and the film thickness t for a TCD of zero, between the cut angle $\mu$ and the film thickness t therefor, and between the propagation direction $\theta$ and the film thickness t therefor, respectively. Referring to FIG. 8, the cut angle $\mu$ and the propagation direction (angle) $\theta$ are set to be zero, and only the cut angle $\lambda$ changes. The propagation conditions are given by Eulerian angles (90°+$\lambda$, 90°, 90°). The propagation direction is always aligned with the Z-axis, but the cut angle $\lambda$ changes within a range between an angle (0°) obtained when the substrate surface is perpendicular to the X-axis and an angle (35°) obtained when the substrate is rotated through 35° to about the Z-axis. Various experimental data which indicate various relationships between the TCD and the film thickness t were obtained and can be shown by a graph such as the ones shown in FIG. 6 or 7. The film thicknesses t for TCDs of 0, 5 and −5 ppm/°C. were read off according to the graph. The film thicknesses t were read off and plotted, and plotted points were connected by lines shown in FIG. 8. Referring to FIG. 8, the solid curve shows the relationship between the film thickness t and the cut angle $\lambda$ when the TCD is set at zero; the dotted curve shows this relationship when the TCD is set at 5 ppm/°C.; and the alternate long and short dash curve shows this relationship when the TCD is set at −5 ppm/°C. The solid curve may be expressed by approximation as a function $t=G(\lambda, 0, 0)$ of the cut angle $\lambda$, where $G(\lambda, 0, 0)$ is given by equation (14) below:

$$G(\lambda, 0, 0) = 1.27 \times 10^{-2} + 7.2 \times 10^{-5}\lambda - \quad (14)$$
$$4.0 \times 10^{-5}\lambda^2 + 1.3 \times 10^{-6}\lambda^3 - 1.4 \times 10^{-8}\lambda^4$$

The dotted curve may be expressed by approximation as a function $t=F(\lambda, 0, 0)$ of the cut angle $\lambda$, and the alternate long and short dash curve may be expressed by approximation as a function $t=f(\lambda, 0, 0)$ of the cut angle $\lambda$.

As is apparent from FIG. 8, if $\mu=\theta=0$, then the film thickness t of the electrode is set at a value given by function $G(\lambda, 0, 0)$ which is obtained by substituting the cut angle $\lambda$ into equation (14), thereby obtaining a surface acoustic wave device having a TCD of zero. Furthermore, when the normalized film thickness t falls within a range given by equation (10) below, the absolute value of the TCD is set to be 5 ppm/°C. or less:

$$f(\lambda, 0, 0) \leq t \leq F(\lambda, 0, 0) \quad (10)$$

Referring to FIG. 9, the cut angle $\lambda$ and the propagation direction $\theta$ was set to be zero, and only the cut angle $\mu$ was varied. The propagation conditions are thus expressed by Eulerian angles (90°, 90°+$\mu$, 90°). FIG. 9 is the graph obtained by plotting many experimental data each indicating the relationship between the TCD and the film thickness t in the same manner as in FIG. 8. The solid curve shows the relationship between the film thickness t and the cut angle $\mu$ when the TCD is set at 0 ppm/°C.; the dotted curve shows this relationship when the TCD is set at 5 ppm/°C.; and the alternate long and short dash curve shows this relationship when the TCD is set at −5 ppm/°C. The solid curve may be expressed by approximation as a function $t=G(0, \mu, 0)$ of the cut angle $\mu$ where the function $G(0, \mu, 0)$ is given by equation (15) below:

$$G(0, \mu, 0) = 1.3 \times 10^{-2} - 2.9 \times 10^{-4}\mu + \quad (15)$$
$$2.5 \times 10^{-4}\mu^2 - 2.5 \times 10^{-5}\mu^3 + 8.6 \times 10^{-7}\mu^4 - 1.0 \times 10^{-8}\mu^5$$

Similarly, the dotted curve may be expressed by approximation as $t=F(0, \mu, 0)$, and the alternate long and short dash curve as $t=f(0, \mu, 0)$. When the normalized film thickness t is set within a range given by inequality (11) below as a function of the cut angle $\mu$, the absolute value of the TCD is set to be 5 ppm/°C. or less:

$$f(0, \mu, 0) \leq t \leq F(0, \mu, 0) \quad (11)$$

FIG. 10 is a graph showing the relationship between the film thickness t and the propagation direction $\theta$ when the cut angles $\lambda$ and $\mu$ were set to be zero and only the propagation direction $\theta$ was varied. The propagation conditions are given by Eulerian angles (90°, 90°, 90°+$\theta$). Referring to FIG. 10, the solid curve shows the relationship between the film thickness t and the propagation or transfer direction $\theta$ when the TCD is set at 0 ppm/°C.; the dotted curve shows this relationship when the TCD is set at 5 ppm/°C.; and the alternate long and short dash curve shows this relationship when the TCD is set at −5 ppm/°C. The solid curve may be expressed by approximation as a function $t=G(0, 0, \theta)$ of the propagation direction $\theta$ where the function $G(0, 0, \theta)$ is given by equation (16) as follows:

$$G(0, 0, \theta) = 1.3 \times 10^{-2} + 1.0 \times 10^{-4}\theta - \quad (16)$$
$$2.2 \times 10^{-4}\theta^2 + 8.5 \times 10^{-6}\theta^3$$

Similarly, the dotted curve may be expressed by approximation as $t=F(0, 0, \theta)$ and the alternate along and short dash curve may be expressed by approximation as $t=f(0, 0, \theta)$. As a result, when the film thickness t is set within a range given by inequality (12) below as a function of the propagation direction $\theta$, the absolute value of the TCD is set at 5 ppm/°C. or less.

$$f(0, 0, \theta) \leq t \leq F(0, 0, \theta) \quad (12)$$

As described above, if any two of the variables $\lambda$, $\mu$ and $\theta$ are set to be zero, the remaining variable $\lambda$, $\mu$ or $\theta$ may be substituted into the equations (3) to (8) obtained by approximation so as to determine the ranges of inequality (10), (11) or (12). In this manner, the normalized film thickness t of the electrode can be set to fall within the range given by inequality (10), (11) or (12), and the absolute value of the TCD can be set at 5 ppm/°C. or less. In the case of manufacturing the substrate, the crystal is pulled, for example, along the X-axis, and an obtained single crystal mass is cut along the direction perpendicular to the X-axis so as to provide an easy manufacturing process. Therefore, in practice, it is preferred that any two of the variables $\lambda$, $\mu$ and $\theta$ be set to be zero.

In general, in the propagation conditions given by the Eulerian angles ($90°+\lambda$, $90°+\mu$, $90°+\theta$), the film thickness t of the electrode may be presented so as to allow the TCD to fall within the range between $-5$ ppm/°C. and 5 ppm/°C. in accordance with a given set of cut angles $\lambda$ and $\mu$ and a propagation direction $\theta$. The range of the normalized film thickness t is expressed as a function of the variables $\lambda$, $\mu$ and $\theta$, as given by inequality (2):

$$f(\lambda, \mu, \theta) \leq t \leq F(\lambda, \mu, \theta) \qquad (2)$$

Functions $F(\lambda, \mu, \theta)$ and $f(\lambda\mu, \theta)$ satisfy equations (3) to (8). The maximum value of thickness t given by function $F(\lambda, \mu, \theta)$ and the minimum value of thickness t given by $f(\lambda, \mu, \theta)$ for a given set of cut angles $\lambda$ and $\mu$ and a propagation direction $\theta$ can be readily obtained by experiment. For example, when the propagation conditions are expressed by Eulerian angles (100°, 100°, 95°) where $\lambda=10$, $\mu=10$ and $\theta=5$, the normalized thickness t of the Al film is set to be 0.017 (0.017 times the wavelength of the surface acoustic wave) so as to obtain a TCD of 0.

In the Li$_2$B$_4$O$_7$ single crystal substrate without an Al film, it was apparent from the experiment of the present inventors that the TCD becomes 0 when the cut angles $\lambda$ and $\mu$ and the propagation direction $\theta$ satisfy equation (9) below:

$$(\lambda/25)^2+(\mu/10)^2+(\theta/8)^2=1 \qquad (9)$$

For example, when the cut angles $\lambda$ and $\mu$ and the propagation direction $\theta$ are set at 25, 0 and 0, respectively, the TCD becomes 0 as indicated by the hollow circle shown in FIG. 6. For this reason, when the cut angles of the substrate and the propagation direction are set to satisfy equation (9), and the normalized film thickness t of the electrode is set to satisfy inequality (2), the TCD becomes 0 or almost 0 in the electrode region and the nonelectrode region of the substrate surface. For example, when the propagation conditions are expressed by Eulerian angles (115°, 90°, 90°), the film thickness of the Al electrode is set to be about 0.004 times the wavelength of the surface acoustic wave, as shown in FIGS. 6 and 8. When the propagation conditions are expressed by Eulerian angles (90°, 100°, 90°), the film thickness of the Al electrode is set to be about 0.017 times the wavelength the surface acoustic wave, as shown in FIG. 9. Furthermore, when the propagation conditions are expressed by Eulerian angles (90°, 90°, 98°), the film thickness of the Al electrode is set to be about 0.005 times the wavelength of the surface acoustic wave, as shown in FIG. 10. For each of these cases, the TCD becomes zero in the whole region of the substrate. When the cut angles of the substrate and the propagation direction are set to satisfy equation (9), the obtained surface acoustic wave device can be effectively applied to a delay line with a tap, where the Al film is irregularly formed in the propagation path on the surface of the substrate.

The present invention is not limited to the particular embodiments described above. Various changes and modifications may be made within the spirit and scope of the present invention. In particular, the electrode material is not limited to aluminum. For example, a small amount of copper (Cu), silicon (Si) or molybdenum (Mo) may be added to aluminum to improve its resistance to corrosion. In this case, the elastic constant of the electrode is substantially the same as that of pure aluminum, so that the mathematical expressions described above can be used to set the film thickness of the electrode.

Furthermore, when gold (Au) is used to form the electrode, the experimental formulae can be obtained in the same manner as equations (3) to (8) for the aluminum electrode. In addition to the modifications described above, a chromium (Cr), tungsten (W) or silica (SiO$_2$) film may be sandwiched between the substrate and the electrode film so as to improve adhesion between the substrate and the electrode film. In this case, the present invention can be effectively applied to obtain a high-performance surface acoustic wave device. It should be noted that the electrode film may be formed by vacuum deposition, sputtering or plating, as needed.

What we claim is:

1. A temperature compensated surface acoustic wave device comprising:

a substrate formed of a lithium tetraborate single crystal, cut angles of said substrate and the propagation direction of a surface acoustic wave being expressed by Eulerian angles $$(90°+\lambda, 90°+\mu, 90°+\theta);$$

a film-like electrode formed on said substrate and having a thickness t normalized by a wavelength of said surface acoustic wave, said electrode being formed of a metallic material comprising aluminum, and the thickness t being set to satisfy the inequality (2) below:

$$f(\lambda, \mu, \theta) \leq t \leq F(\lambda, \mu, \theta) \qquad (2)$$

where functions $F(\lambda, \mu, \theta)$ and $f(\lambda, \mu, \theta)$ satisfy equations (3) to (8) below:

$$F(\lambda, 0, 0) = 1.6 \times 10^{-2} + 8.8 + 10^{-6}\lambda - 3.5 \times 10^{-5}\lambda^2 + 1.1 \times 10^{-6}\lambda^3 - 1.3 \times 10^{-8}\lambda^4 \qquad (3)$$

$$F(0, \mu, 0) = 1.6 \times 10^{-2} + 5.3 \times 10^{-4}\mu + 5.9 \times 10^{-5}\mu^2 - 8.6 \times 10^{-6}\mu^3 + 2.7 \times 10^{-7}\mu^4 - 2.9 \times 10^{-9}\mu^5 \qquad (4)$$

$$F(0, 0, \theta) = 1.6 \times 10^{-2} - 2.4 \times 10^{-4}\theta - 1.0 \times 10^{-4}\theta^2 + 3.4 \times 1.^{-7}\theta^3 \qquad (5)$$

$$f(\lambda, 0, 0) = 9.5 \times 10^{-3} + 1.2 \times 10^{-4}\lambda - 3.9 \times 10^{-5}\lambda^2 + 1.3 \times 10^{-6}\lambda^3 - 1.6 \times 10^{-8}\lambda^4 \qquad (6)$$

$$f(0, \mu, 0) = 9.5 \times 10^{-3} + 8.4 \times 10^{-4}\mu - 9.4 \times 10^{-5}\mu^2 + 6.6 \times 10^{-6}\mu^3 - 3.0 \times 10^{-7}\mu^4 + 4.5 \times 10^{-9}\mu^5 \qquad (7)$$

$$f(0, 0, \theta) = 9.5 \times 10^{-3} \times 3.0 \times 10^{-4}\theta - 2.0 \times 10^{-4}\theta^2 + 3.6 \times 10^{-6}\theta^3 \qquad (8)$$

and, said electrode generating said surface acoustic wave, said surface acoustic wave being propagated along a surface of said substrate along the propagation direction.

2. A device according to claim 1, wherein the angles $\lambda$, $\mu$, and $\theta$ are set to satisfy equation (9) below:

$$(\lambda/25)^2 + (\mu/10)^2 + (\theta/8)^2 = 1 \tag{9}$$

3. A device according to claim 1, wherein the cut angles of said substrate and the propagation direction of the surface acoustic wave are expressed by Eulerian angles (90°+$\lambda$, 90°, 90°), and the thickness t of said electrode is set to satisfy inequality (10) below:

$$f(\lambda, 0, 0) \leq t \leq F(\lambda, 0, 0) \tag{10}$$

4. A device according to claim 3, wherein the angle $\lambda$ is set at about 25° or −25°.

5. A device according to claim 1, wherein the cut angles of said substrate and the propagation direction of the surface acoustic wave are expressed by Eulerian angles (90°, 90°+$\mu$, 90°), and the thickness t of said electrode is set to satisfy inequality (11) below:

$$f(0, \mu, 0) \leq t \leq F(0, \mu, 0) \tag{11}$$

6. A device according to claim 5, wherein the angle $\mu$ is set at about 10° or −10°.

7. A device according to claim 1, wherein the cut angles of said substrate and the propagation direction of the surface acoustic wave are expressed by Eulerian angles (90°, 90°, 90°+$\theta$), and the thickness t of said electrode is set to satisfy inequality (12) below:

$$f(0, 0, \theta) \leq t \leq F(0, 0, \theta) \tag{12}$$

8. A device according to claim 7, wherein the angle $\theta$ is set at about 8° or −8°.

* * * * *